United States Patent
Hayashi

(10) Patent No.: US 9,936,583 B2
(45) Date of Patent: Apr. 3, 2018

(54) WIRING BOARD AND MOUNTING STRUCTURE USING THE SAME

(71) Applicant: KYOCERA Corporation, Kyoto-shi, Kyoto (JP)

(72) Inventor: Katsura Hayashi, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 10 days.

(21) Appl. No.: 15/028,998

(22) PCT Filed: Oct. 29, 2014

(86) PCT No.: PCT/JP2014/078770
§ 371 (c)(1),
(2) Date: Apr. 13, 2016

(87) PCT Pub. No.: WO2015/064642
PCT Pub. Date: May 7, 2015

(65) Prior Publication Data
US 2016/0278214 A1 Sep. 22, 2016

(30) Foreign Application Priority Data

Oct. 30, 2013 (JP) .................................. 2013-225359

(51) Int. Cl.
*H05K 1/18* (2006.01)
*H05K 3/00* (2006.01)
(Continued)

(52) U.S. Cl.
CPC ......... *H05K 1/186* (2013.01); *H01L 21/4846* (2013.01); *H01L 23/5383* (2013.01);
(Continued)

(58) Field of Classification Search
CPC ............. H01L 23/5383; H01L 23/5384; H01L 23/5386; H01L 23/5389;
(Continued)

(56) References Cited

U.S. PATENT DOCUMENTS 4,602,318 A * 7/1986 Lassen .................. H01L 21/486
174/261
4,758,927 A * 7/1988 Berg ...................... H05K 3/325
29/827

(Continued)

FOREIGN PATENT DOCUMENTS

| JP | 2010-114434 A | 5/2010 |
|----|---------------|--------|
| JP | 2010-283043 A | 12/2010 |
| WO | 2012/137626 A1 | 10/2012 |

OTHER PUBLICATIONS

Japanese Office Action with English concise explanation, Japanese Patent Application No. 2015-545271, dated Feb. 14, 2017, 5 pgs.

(Continued)

*Primary Examiner* — Timothy Thompson
*Assistant Examiner* — Rhadames J Alonzo Miller
(74) *Attorney, Agent, or Firm* — Volpe and Koenig, P.C.

(57) ABSTRACT

A wiring board is provided which includes an insulating layer; and a frame body disposed on the insulating layer. The frame body is provided with a through-hole. The insulating layer has a concave portion in one main surface on a frame body side. In a plan view of the wiring board, the concave portion has a first portion positioned at the through-hole, and a second portion which is positioned at the frame body and is continuous with the first portion. An air gap is formed between the frame body and the insulating layer in the second portion.

9 Claims, 12 Drawing Sheets

(51) Int. Cl.
   *H05K 3/46* (2006.01)
   *H01L 21/48* (2006.01)
   *H01L 23/538* (2006.01)
   *H01L 23/00* (2006.01)
   *H05K 1/02* (2006.01)
   *H05K 1/11* (2006.01)

(52) U.S. Cl.
   CPC ...... *H01L 23/5384* (2013.01); *H01L 23/5386* (2013.01); *H01L 23/5389* (2013.01); *H01L 24/17* (2013.01); *H05K 1/0298* (2013.01); *H05K 1/113* (2013.01); *H05K 1/115* (2013.01); *H05K 3/0044* (2013.01); *H05K 3/4673* (2013.01); *H05K 3/4697* (2013.01); *H01L 2224/131* (2013.01); *H01L 2224/16227* (2013.01); *H01L 2224/16235* (2013.01); *H01L 2924/01028* (2013.01); *H01L 2924/01079* (2013.01); *H01L 2924/14* (2013.01); *H01L 2924/1461* (2013.01); *H01L 2924/1533* (2013.01); *H01L 2924/15153* (2013.01); *H01L 2924/15313* (2013.01); *H01L 2924/15738* (2013.01); *H01L 2924/15747* (2013.01); *H05K 2201/2072* (2013.01); *H05K 2203/025* (2013.01)

(58) Field of Classification Search
   CPC .. H01L 2924/15153; H01L 2924/1533; H05K 1/0298; H05K 3/4697
   USPC .......................................................... 361/761
   See application file for complete search history.

(56) References Cited

U.S. PATENT DOCUMENTS

| | | | |
|---|---|---|---|
| 6,066,386 A * | 5/2000 | Boyko | H01L 21/486 174/255 |
| 2003/0000737 A1* | 1/2003 | Liu | B81B 7/0041 174/256 |
| 2009/0107708 A1* | 4/2009 | Takahashi | H05K 1/183 174/257 |
| 2009/0215231 A1* | 8/2009 | Inoue | H01L 24/82 438/125 |
| 2010/0084175 A1 | 4/2010 | Suzuki et al. | |
| 2010/0208442 A1* | 8/2010 | Asano | H01L 21/563 361/783 |
| 2014/0030471 A1 | 1/2014 | Otsubo | |
| 2015/0077960 A1* | 3/2015 | Gonzales | B23K 1/0016 361/764 |

OTHER PUBLICATIONS

Unknown: "Laser-drilled Microvias," 2015, XP055350076, Retrieved from the Internet: URL:http://tiger-world-corp.com/wp-content/uploads/2015/09/Microvia.jpg [retrieved on Feb. 28, 2017].
Coombs, Clyde, "Trace Shape Development," In: Printed Circuits Handbook, Oct. 1, 2007 (Oct. 1, 2007), McGraw-Hill, XP055350329, pp. 34.22-34, 24.
Extended European Search Report, European Patent Application No. 14857525.1, dated Mar. 29, 2017, 8 pgs.

* cited by examiner (a)

(b)

(a)

(b)

(c)

(d)

(a)

(b)

(c)

(d)

(a)

(b)

(a)

(b)

(a)

(b)

(a)

(b)

(a)

(b)

(a)

(b)

WIRING BOARD AND MOUNTING STRUCTURE USING THE SAME

TECHNICAL FIELD

The present invention relates to a wiring board which is used in electronic devices (such as various audiovisual devices, household electrical appliances, communication devices, computer devices, and peripheral devices thereof) and a mounting structure using the same.

BACKGROUND ART

In the related art, a mounting structure configured such that electronic components are mounted on a wiring board has been used in electronic devices.

For example, Patent Literature 1 discloses a wiring board which includes a resin insulating layer (insulating layer) and a reinforcing material (frame body) disposed on the insulating layer and having a through-hole along a thickness direction thereof. In addition, Patent Literature 1 discloses a mounting structure which includes the aforementioned wiring board, a chip component (electronic component) disposed on the insulating layer inside the through-hole, and an underfill material (resin member) disposed in one main surface of the electronic component and the insulating layer.

CITATION LIST

Patent Literature

Patent Literature 1: Japanese Unexamined Patent Publication JP-A 2010-283043

SUMMARY OF INVENTION

Technical Problem

Incidentally, there is a case where when heat is applied to a mounting structure while an electronic component is mounted or used, stress is applied between an insulating layer and a frame body due to a difference between thermal expansion coefficients of the insulating layer and the frame body, and the insulating layer separates from the frame body. In this case, if a plurality of conductive layers are formed between the insulating layer and the frame body, ion migration easily occurs at the separation portion. As a result, the conductive layers are easily short-circuited, and electrical reliability of the wiring board easily deteriorates.

An object of the invention is to provide a wiring board with excellent electrical reliability and a mounting structure using the same.

Solution to Problem

According to one embodiment of the invention, a wiring board includes: an insulating layer; and a frame body disposed on the insulating layer, the frame body being provided with a through-hole, the insulating layer having a concave portion in one main surface on a frame body side, in a plan view of the wiring board, the concave portion having a first portion positioned at the through-hole, and a second portion which is positioned at the frame body and is continuous with the first portion, an air gap being formed between the frame body and the insulating layer in the second portion.

According to one embodiment of the invention, a mounting structure includes: the wiring board as described above; an electronic component disposed on the insulating layer and inside the through-hole; and a resin member which is disposed in the first portion, a part of which enters the air gap.

Advantageous Effects of Invention

According to the wiring board of the invention, it is possible to obtain a wiring board with excellent electrical reliability that is capable of reducing separation of the frame body and the insulating layer since an air gap is included between the frame body and the insulating layer in the second portion and the resin member enters the air gap.

According to the mounting structure of the invention, it is possible to obtain a mounting structure with excellent electrical reliability since the aforementioned wiring board is included and a part of the resin member enters the air gap between the frame body and the insulating layer.

DESCRIPTION OF EMBODIMENTS

Hereinafter, a detailed description will be given of a mounting structure provided with a wiring board according to an embodiment of the invention with reference to drawings.

Figure 1:
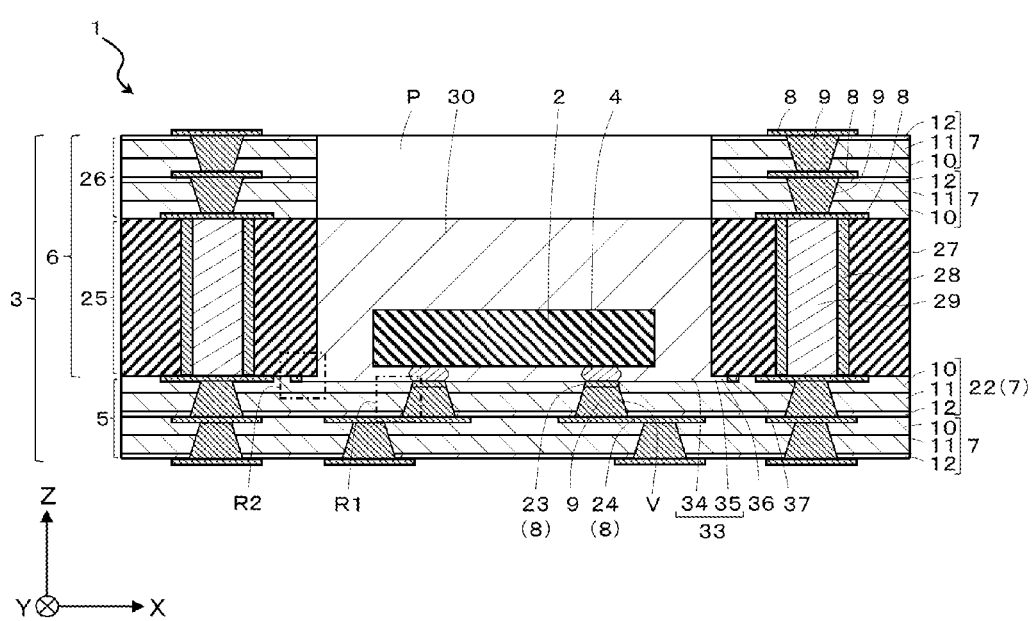
FIG. 1 is a sectional view of a mounting structure according to one embodiment of the invention taken along a thickness direction.

A mounting structure 1 shown in FIG. 1 is used in electronic devices such as various audiovisual devices, household electrical appliances, communication devices, computer devices, or peripheral devices thereof. The mounting structure 1 includes an electronic component 2 and a wiring board 3 on which the electronic component 2 is mounted.

The electronic component 2 is a semiconductor device such as an IC, an LSI, a CCD, or a CMOS, a SAW device, or a MEMS device, for example. The electronic component 2 is flip-chip mounted on the wiring board 3 via a bump 4 made of a conductive material such as solder.

The wiring board 3 includes a substrate 5 and a frame body 6 which is disposed on the substrate 5 and includes a through-hole P penetrating in a thickness direction (Z direction) thereof. The wiring board 3 is mounted on an external circuit board (not shown) such as a mother board.

The substrate 5 has a function of supplying a power source and a signal for driving or controlling the electronic component 2 from an external circuit board to the electronic component 2. The substrate 5 includes a plurality of insulating layers 7, a plurality of conductive layers 8 which are respectively disposed on both main surfaces of the insulating layers 7 and spaced away from each other in a thickness direction or a main surface direction (XY plane direction) of the insulating layers 7, and a plurality of via conductors 9 which penetrate through the insulating layers 7 in the thickness direction and are electrically connected to the conductive layers 8. The conductive layers 8 are not disposed inside the insulating layers 7. The via conductors 9 electrically connect two conductive layers 8 spaced away from each other in the thickness direction via the insulating layers 7. In the embodiment, the substrate 5 is a coreless substrate with no core substrate, the number of the insulating layers 7 is two, and the number of the conductive layers 8 is three. In addition, the numbers of the insulating layers 7 and the conductive layers 8 may be arbitrary numbers. The frame body 6 is provided with a through-hole P extending along the thickness direction of the insulating layers 7.

The insulating layers 7 function as insulating members between the conductive layers 8 spaced away from each other in the thickness direction or the main surface direction and as insulating members between via conductors 9 spaced away from each other in the main surface direction. Each insulating layer 7 includes a first resin layer 10, an inorganic insulating layer 11 disposed on the first resin layer 10 on the opposite side to the electronic component 2, and a second resin layer 12 disposed on the inorganic insulating layer 11 on the opposite side to the first resin layer 10.

Figure 3:
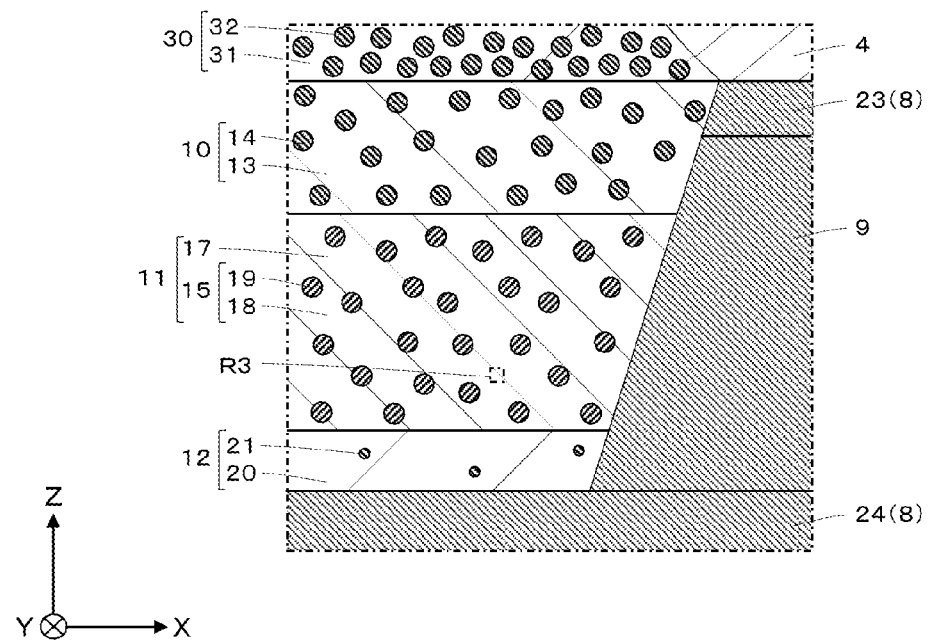
FIG. 3($a$) is an enlarged view of an R1 portion in FIG. 1 and FIG. 3($b$) is an enlarged view of an R3 portion in FIG. 3($a$)
Figure 3:
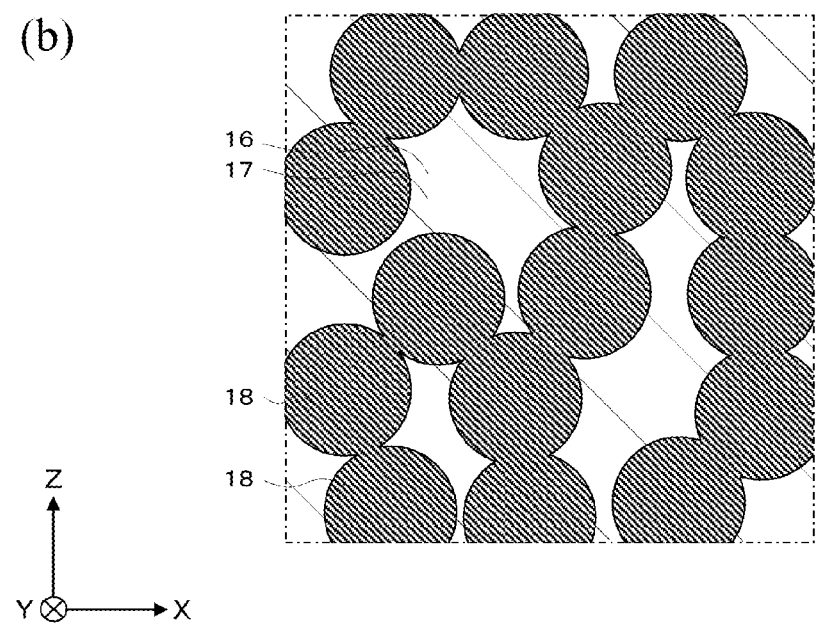

The first resin layer 10 functions as an adhesive member for adhering to another insulating layer 7 or the frame body 6. As shown in FIG. 3(a), the first resin layer 10 includes a first resin 13 and a plurality of first filler particles 14 dispersed in the first resin 13. The thickness of the first resin layer 10 is equal to or greater than 3 μm and equal to or less than 30 μm, for example. A Young's modulus of the first resin layer 10 is equal to or greater than 0.2 GPa and equal to or less than 20 GPa, for example. The thermal expansion coefficient of the first resin layer 10 in each direction is equal to or greater than 20 ppm/° C. and equal to or less than 50 ppm/° C., for example.

The Young's modulus of the first resin layer 10 is measured by a method based on ISO14577-1:2002 by using a Nano Indenter XP manufactured by MTS Systems Corporation. In addition, the thermal expansion coefficient of the first resin layer 10 is measured by a measurement method based on JIS K7197-1991 by using a commercially available TMA (Thermo-Mechanical Analysis) device. Hereinafter, Young's moduli and thermal expansion coefficients of the respective members are measured in the same manner as that for the first resin layer 10.

The first resin 13 is a main part of the first resin layer 10 and functions as an adhesive member. The first resin layer 13 is made of a resin material such as epoxy resin, bismaleimide-triazine resin, cyanate resin, or polyimide resin, and particularly, the first resin layer 13 is preferably made of epoxy resin.

The first filler particles 14 cause the first resin layer 10 to have a low thermal expansion coefficient and high rigidity. The first filler particles 14 are made of an inorganic insulating material such as silicon oxide, aluminum oxide, aluminum nitride, aluminum hydroxide, or calcium carbonate, and particularly, the first filler particles 14 are preferably made of silicon oxide. The particle diameter of the first filler particles 14 is equal to or greater than 0.5 μm and equal to or less than 5 μm, for example. The content rate of the first filler particles 14 in the first resin layer 10 is equal to or greater than 3% by volume and equal to or less than 60% by volume, for example.

In addition, the particle diameter of the first filler particles 14 can be measured by calculating particle diameters of the respective particles in a section in the thickness direction of the wiring board 3. Moreover, the content rate of the first filler particles 14 in the first resin layer 10 can be measured by regarding a rate of an area of the first filler particles 14 occupying the first resin layer 10 as a content rate (% by volume) in the section in the thickness direction of the wiring board 3. Hereinafter, particle diameters and content rates of the respective particles will be measured in the same manner as that for the first filler particles 14.

Since the inorganic insulating layer 11 has a higher Young's modulus and a lower thermal expansion coefficient than those of the first resin layer 10 and the second resin layer 12, the inorganic insulating layer 11 reduces a difference between the thermal expansion coefficients of the electronic component 2 and the wiring board 3. In doing so, it is possible to suppress warpage due to the difference between the thermal expansion coefficients of the electronic component 2 and the wiring board 3 when heat is applied to the mounting structure 1 while the electronic component 2 is mounted or operated. Therefore, it is possible to suppress breakage of a connecting portion between the electronic component 2 and the wiring board 3 due to the warpage and to enhance reliability in the connection between the electronic component 2 and the wiring board 3.

As shown in FIGS. 3(a) and 3(b), the inorganic insulating layer 11 includes a plurality of inorganic insulating particles 15, parts of which are connected to each other, and a resin portion 17 which is disposed in a part of a gap 16 between the inorganic insulating particles 15. In addition, the inorganic insulating layer 11 has a porous body with a three-dimensional net-like structure by the inorganic insulating particles 15 connected to each other. The connecting portion of the plurality of inorganic insulating particles 15 has a constricted shape and forms a neck structure. The thickness of the inorganic insulating layer 11 is equal to or greater than 3 μm and equal to or less than 30 μm, for example. The Young's modulus of the inorganic insulating layer 11 is equal to or greater than 10 GPa and equal or less than 50 GPa, for example. In addition, the thermal expansion coefficient of the inorganic insulating layer 11 in each direction is equal to or greater than 0 ppm/° C. and equal to or less than 10 ppm/° C., for example.

Since the plurality of inorganic insulating particles 15 are partially connected to each other, constrain each other, and do not flow, the inorganic insulating particles 15 increase the Young's modulus of the inorganic insulating layer 11 and reduce the thermal expansion coefficient in each direction. The inorganic insulating particles 15 include a plurality of first inorganic insulating particles 18 which are partially connected to each other and a plurality of second inorganic insulating particles 19 which have a larger average particle diameter than that of the first inorganic insulating particles 18, are partially connected to the first inorganic insulating particles 18, and are spaced away from each other with the first inorganic insulating particles 18 interposed therebetween.

The first inorganic insulating particles 18 function as adhesive members in the inorganic insulating layer 11. In addition, since the first inorganic insulating particles 18 have a small particle diameter and thus fixedly adhere as will be described later, the first inorganic insulating particles 18 can cause the inorganic insulating layer 11 to have a low thermal expansion coefficient and a high Young's modulus. The first inorganic insulating particles 18 are made of an inorganic insulating material such as silicon oxide, zirconium oxide, aluminum oxide, boron oxide, magnesium oxide, or calcium oxide, for example, and particularly, the first inorganic insulating particles 18 are preferably made of silicon oxide in terms of a low thermal expansion coefficient and a low dielectric tangent. The silicon oxide is preferably in an amorphous (non-crystalline) state in order to reduce an anisotropic aspect of the thermal expansion coefficient due to a crystalline structure. The content rate of silicon oxide in the first inorganic insulating particles 18 is equal to or greater than 99.9% by mass and equal to or less than 100% by mass, for example. The first inorganic insulating particles 18 have spherical shapes, for example. The particle diameter of the first inorganic insulating particles 18 is equal to or greater than 3 nm and equal to or less than 110 nm, for example.

The second inorganic insulating particles 19 suppress the extension of cracks occurring in the inorganic insulating layer 11 due to a larger particle diameter than that of the first inorganic insulating particles 18. The second inorganic insulating particles 19 have the same material and properties as those of the first inorganic insulating particles 18, for example. The second inorganic insulating particles 19 have spherical shapes, for example. The particle diameter of the second inorganic insulating particles 19 is equal to or greater than 0.5 µm and equal to or less than 5 µm.

The inorganic insulating layer 11 has a gap 16, and the gap 16 is an opened pore and has openings in one main surface and the other main surface of the inorganic insulating layer 11. In addition, since a plurality of inorganic insulating particles 15, parts of which are connected to each other, form a porous body, at least a part of the gap 16 is surrounded by the inorganic insulating particles 15 in a section in the thickness direction of the inorganic insulating layer 11.

Since the resin portion 17 is made of a resin material which is more easily elastically deformed than the inorganic insulating material, the resin portion 17 reduces stress applied to the inorganic insulating layer 11 and suppresses the occurrence of cracks in the inorganic insulating layer 11. The resin portion 17 according to the embodiment is a part of the first resin 13 which forms the first resin layer 10 which has entered the gap 16. As a result, it is possible to enhance adhesion strength between the inorganic insulating layer 11 and the first resin layer 10.

The second resin layer 12 has a thinner thickness and a lower Young's modulus than those of the first resin layer 10, and the second resin layer 12 has a function of alleviating thermal stress between the inorganic insulating layer 11 and the conductive layer 8. The thickness of the second resin layer 12 is equal to or greater than 0.1 µm and equal to or less than 5 µm, for example. The Young's modulus of the second resin layer 12 is equal to or greater than 0.05 GPa and equal to or less than 5 GPa, for example. The thermal expansion coefficient of the second resin layer 12 in each direction is equal to or greater than 20 ppm/° C. and equal to or less than 100 ppm/° C., for example.

As shown in FIG. 3(a), the second resin layer 12 includes a second resin 20 and a plurality of second filler particles 21 dispersed in the second resin 20. The content rate of the second filler particles 21 in the second resin layer 12 is equal to or greater than 0.05% by volume and equal to or less than 10% by volume, for example.

The second resin 20 has the same material and properties as those of the first resin 13, for example. The second filler particles 21 have the same material and properties as those of the first filler particles 14, for example. The second filler particles 21 have spherical shapes, for example, and the particle diameter of the second filler particles 21 is equal to or greater than 0.05 µm and equal to or less than 0.7 µm, for example.

The conductive layers 8 function as wiring such as grounding wiring, power supply wiring, or signal wiring. The conductive layers 8 are made of a conductive material such as copper, silver, gold, aluminum, nickel, or chromium, for example. The thickness of the conductive layers 8 is equal to or greater than 3 µm and equal to or less than 20 µm, for example. The thermal expansion coefficient of the conductive layers 8 in each direction is equal to or greater than 14 ppm/° C. and equal to or less than 18 ppm/° C., for example. In addition, the Young's modulus of the conductive layers 8 is equal to or greater than 70 GPa and equal to or less than 150 GPa, for example.

Here, as shown in FIG. 1, it is assumed for convenience that the insulating layer 7 disposed as the outermost layer on the side of the electronic component 2 from among the plurality of insulating layers 7 is the first insulating layer 22.

The conductive layers 8 include a plurality of pads 23 exposed to the inside of the through-hole P of the frame body 6 in the main surface of the first insulating layer 22 on the side of the electronic component 2 and connecting conductors 24 disposed between the one main surface of the first insulating layer 22 and the frame body 6 or disposed on both main surfaces of the insulating layers 7 other than the first insulating layer 22 from among the plurality of insulating layers 7.

The pads 23 function as terminals electrically connected to the electronic component 2 via the bump 4. The pads 23 are preferably made of nickel. As a result, it is possible to enhance the connection strength between the pads 23 and the bump 4 since nickel of the pads 23 and solder of the bump 4 do not easily form a brittle intermetallic compound. Each via conductor 9 is electrically connected to each of the plurality of pads 23. The pads 23 have a disk shape, for example. The width (diameter) of the pads 23 is equal to or greater than 30 µm and equal to or less than 150 µm, for example. A plated film made of gold may be formed on the surfaces of the pads 23 before mounting the electronic component 2 on the wiring board 3. Since gold of the plated film is diffused in the bump 4 when the electronic component 2 is mounted on the wiring board 3, the plated film disappears.

The connecting conductors 24 have a function of electrically connecting the via conductors 9 spaced away from each other in the thickness direction or the planar direction. The connecting conductors 24 are made of a conductive material which is different from that of the pads 23, for example. The connecting conductors 24 are preferably made of copper. As a result, it is possible to enhance the conductivity of the connecting conductors 24 and to enhance a signal transmission property through the connecting conductors 24. The connecting conductors 24 include a plurality of lands in disk shapes to which the via conductors 9 are electrically connected and a plurality of wiring conductors in thin long shapes which connect the plurality of lands to each other.

The via conductors 9 function as wiring along with the conductive layers 8. The via conductors 9 have the same material and properties as those of the conductive layers 8, for example. The via conductors 9 are disposed in via holes V which penetrate through the insulating layers 7 in the thickness direction. The via conductors 9 according to the embodiment are filled in the via holes V. Each via hole V has a tapered shape with a width decreasing from the opposite side to the electronic component 2 toward the side of the electronic component 2. The width (diameter) of an end of each via conductor 9 on the side of the electronic component 2 is equal to or greater than 10 μm and equal to or less than 100 μm, for example. The width (diameter) of an end of the via conductor 9 on the opposite side to the electronic component 2 is equal to or greater than 12 μm and equal to or less than 120 μm, for example.

The frame body 6 functions as a reinforcing member which suppresses warpage of the substrate 5 by adhering to the one main surface of the substrate 5 due to higher rigidity than that of the substrate 5. In addition, a mounted component (not shown) is mounted on the one main surface of the frame body 6 on the opposite side to the substrate 5. The mounted component forms the mounting structure 1 along with the electronic component 2 and the wiring board 3. The mounted component has the same configuration as that of the electronic component 2, for example.

The frame body 6 includes a core substrate 25 which adheres to the one main surface of the substrate 5 and a built-up layer 26 disposed on the core substrate 25 on the opposite side to the substrate 5. The through-hole P of the frame body 6 is configured such that the through-hole of the core substrate 25 and the through-hole of the built-up layer 26 are in communication with each other.

The core substrate 25 is configured to enhance rigidity of the substrate 5. The core substrate 25 includes a base 27, a tubular through-hole conductor 28 disposed in a through-hole which penetrates through the base 27 in the thickness direction, and a prism-shaped insulating body 29 surrounded by the through-hole conductor 28. The base 27 includes resin such as epoxy resin, a base material such as glass cloth covered by the resin, and filler particles dispersed in the resin and made of silicon oxide or the like, for example. The through-hole conductor 28 is electrically connected to the conductive layers 8 of the substrate 5 and has the same material and properties as those of the conductive layers 8, for example. The insulating body 29 includes resin such as epoxy resin.

The built-up layer 26 has the same configuration as that of the substrate 5 and is disposed on the core substrate 25 on the opposite side to the substrate 5. As a result, since thermal stress applied between the core substrate 25 and the built-up layer 26 acts in the opposite direction to thermal stress applied between the core substrate 25 and the substrate 5 when heat is applied to the wiring board 3, it is possible to suppress warpage of the wiring board 3. The built-up layer 26 includes the insulating layers 7, the conductive layers 8, and the via conductors 9 in the same manner as the substrate 5. The conductive layers 8 and the via conductors 9 in the built-up layer 26 function as wiring which transmits a power source or signals between the mounted component and the external circuit board or the electronic component 2 by electrically connecting the mounted component and the through-hole conductor 28.

Figure 2:
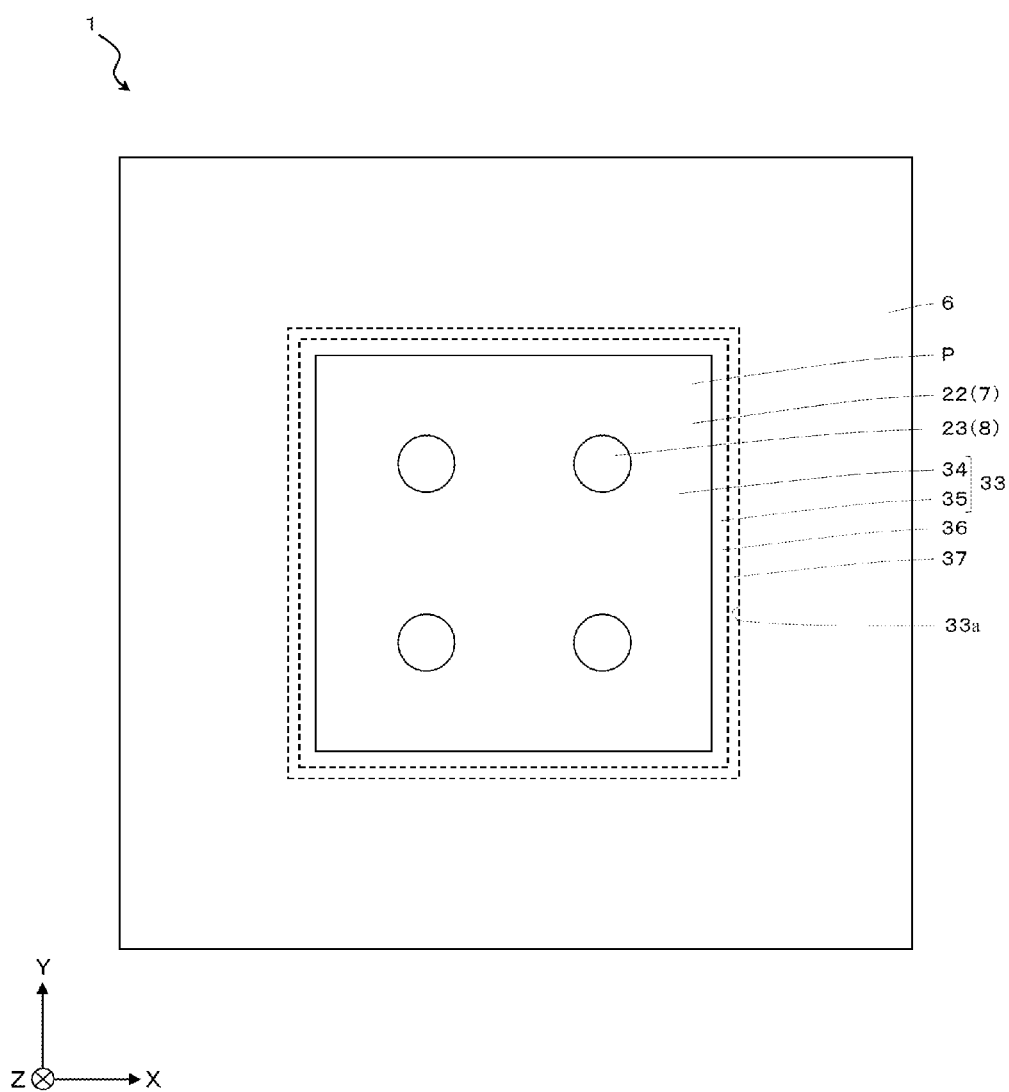
FIG. 2 is a plan view of a wiring board in FIG. 1.

As shown in FIGS. 1 and 2, the through-hole P opens in the one main surface of the wiring board 3 on the opposite side to the substrate 5. In addition, the pads 23 are exposed from the one main surface of the first insulating layer 22 to the inside of the through-hole P. The electronic component 2 and the resin member 30 are disposed in the through-hole P. As shown in FIG. 2, the through-hole P according to the embodiment has a quadrangular prism shape. The lengths of the through-hole P in the vertical direction (Y direction) and the horizontal direction (X direction) in a plan view are equal to or greater than 1 mm and equal to or less than 30 mm, for example. In addition, the through-hole P may have any shape as long as the shape is a prism shape, and may have a cylindrical shape or a polygonal prism shape in a plan view.

The resin member 30 covers the electronic component 2 and is disposed between the electronic component 2 and the one main surface of the first insulating layer 22. The resin member 30 forms the mounting structure 1 along with the electronic component 2, the wiring board 3, and the mounted component. The resin member 30 includes a third resin 31 and a plurality of third filler particles 32 dispersed in the third resin 31. The content rate of the third filler particles 32 in the resin member 30 is equal to or greater than 30% by volume and equal to or less than 70% by volume, for example. The third resin 31 is made of the same material as that of the first resin 13, for example. The third filler particles 32 are made of the same material as that of the first filler particles 14, for example.

Incidentally, there is a case where stress is applied between the first insulating layer 22 and the frame body 6 due to a difference between thermal expansion coefficients of the first insulating layer 22 and the frame body 6 if heat is applied to the mounting structure 1 at the time of mounting or using the electronic component 2.

Figure 4:
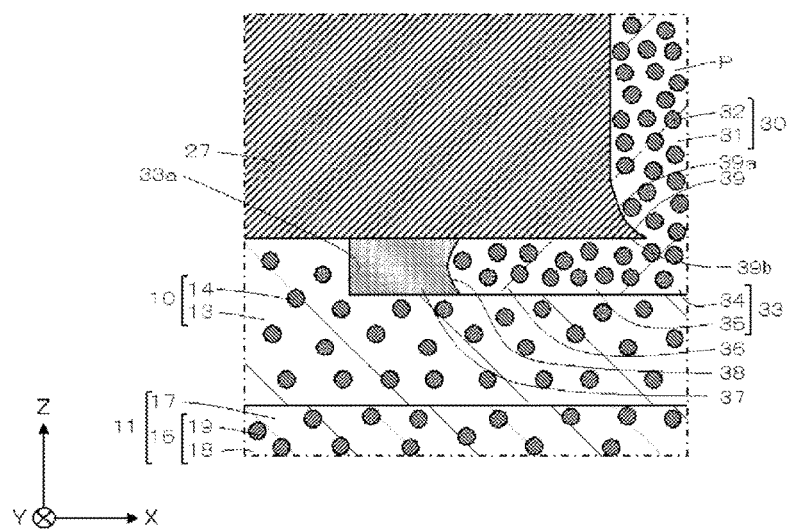
FIG. 4 is an enlarged view of an R2 portion in FIG. 1.
Figure 5:
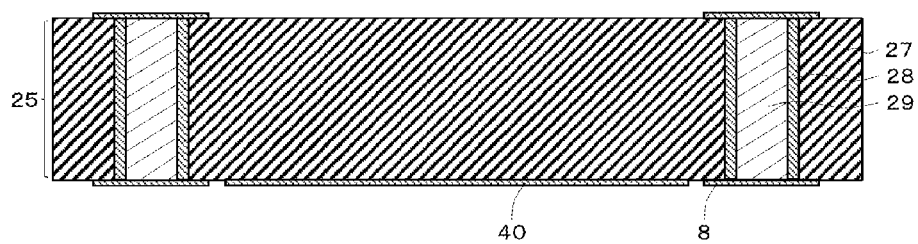
FIGS. 5($a$) to 5($c$) are sectional views illustrating a manufacturing process of the mounting structure shown in FIG. 1, and FIG. 5($d$) is a partial enlarged view of a slurry in FIG. 5($c$)
Figure 5:
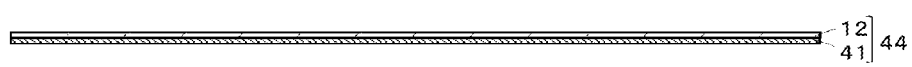
Figure 5:
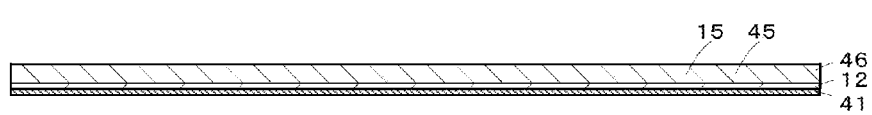
Figure 5:
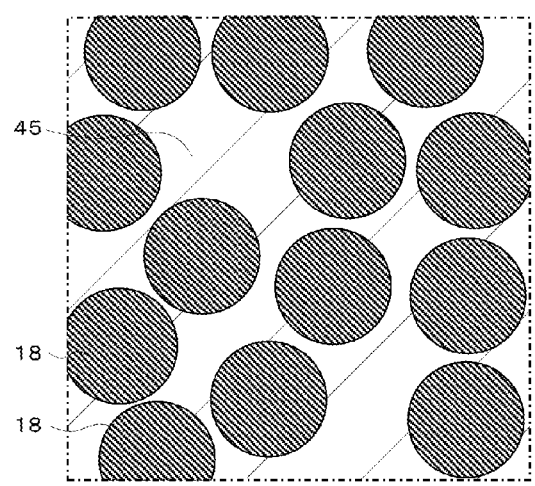
Figure 6:
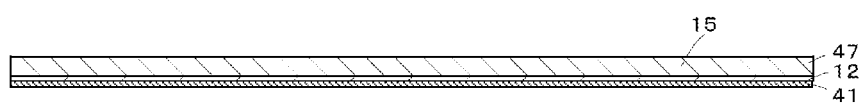
FIG. 6($a$) is a sectional view illustrating the manufacturing process of the mounting structure shown in FIG. 1, FIG. 6($b$) is a partial enlarged view of a powder layer in FIG. 6($a$), FIG. 6($c$) is a sectional view illustrating the manufacturing process of the mounting structure shown in FIG. 1, and FIG. 6($d$) is a partial enlarged view of an inorganic insulating layer in FIG. 6($c$)
Figure 6:
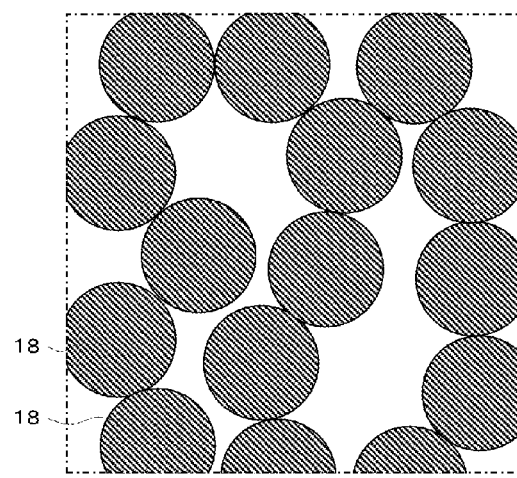
Figure 6:
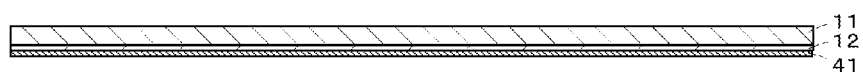
Figure 6:
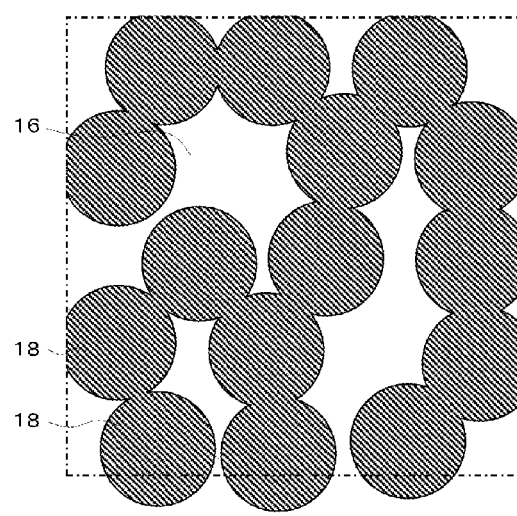
Figure 7:
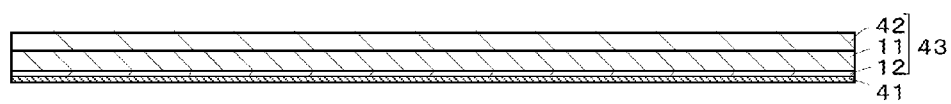
FIG. 7($a$) is a sectional view illustrating the manufacturing process of the mounting structure shown in FIG. 1, and FIG. 7($b$) is a partial enlarged view of an inorganic insulating layer in FIG. 7($a$)
Figure 7:
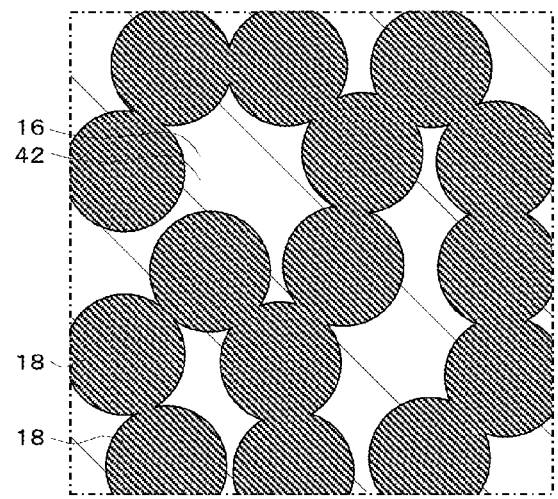

In contrast, according to the embodiment, as shown in FIGS. 1 and 4, the wiring board 3 comprises the first insulating layer (insulating layer 7) and the frame body 6 including the through-hole P along the thickness direction of the first insulating layer 22. The first insulating layer 22 includes a concave portion 33 in the one main surface on the side of the frame body 6. The concave portion 33 includes a first portion 34 positioned in the through hole P and a second portion 35 which is positioned in the frame body 6 and is continuous with the first portion 34 in a plan view. In other words, the concave portion 33 includes the first portion 34 connected to the through hole P and the second portion 35 connected to the first portion 34 and disposed between the first insulating layer 22 and the frame body 6. In yet other words, the first portion 34 is exposed to the inside of the through hole P, and the second portion 35 is positioned in the frame body 6 on the side of the first insulating layer 22 and is not exposed to the inside of the through-hole P.

That is, the frame body 6 is disposed on the first insulating layer 22 at the projection portion other than the concave portion 33, and an air gap 36 is provided between the surface of the frame body 6 on the side of the first insulating layer 22 in the second portion 35 and the surface of the first insulating layer 22. In other words, the second portion 35 includes the air gap 36 which opens to the first portion 34.

In doing so, a part of the resin member 30 disposed between the electronic component 2 and the one main surface of the first insulating layer 22 enters the air gap 36. Therefore, since the resin member 30 adheres to the first insulating layer 22 and the frame body 6, and the resin member 30 thus causes adhesion between the first insulating layer 22 and the frame body 6, it is possible to enhance the adhesion strength between the first insulating layer 22 and the frame body 6. Therefore, it is possible to reduce the separation of the first insulating layer 22 and the frame body 6 and to obtain the wiring board 3 with excellent electrical reliability.

Although the first portion 34 and the air gap 36 form a space before the electronic component 2 is mounted on the wiring board 3, a part of the resin member 30 is disposed in the first portion 34 and the air gap 36 after the electronic component 2 is mounted on the wiring board 3.

As shown in FIGS. 1 and 2, the concave portion 33 according to the embodiment has a quadrangular prism shape. The lengths of the concave portion 33 in the vertical direction (Y direction) and the horizontal direction (X direction) in a plan view are equal to or greater than 1 mm and equal to or less than 30 mm, for example. The depth of the concave portion 33 (Z direction) is equal to or greater than 3 µm and equal to or less than 20 µm. The width of the second portion 35 (the length between the border from the first portion 34 and a concave portion side surface 33a of the concave portion 33) is equal to or greater than 0.1 mm and equal to or less than 2 mm, for example. The width of the air gap 36 (the length between the border from the first portion 34 and a side surface of a metal member 37 which will be described later) is equal to or greater than 0.01 mm and equal to or less than 0.2 mm, for example. In addition, the concave portion 33 may have any shape as long as the shape is a prism shape, and may have a cylindrical shape or a polygonal prism shape.

In the embodiment, as shown in FIG. 2, the second portion 35 surrounds the first portion 34 in a circumferential direction (XY plane direction) of the through-hole P, and the air gap 36 surrounds the first portion 34. As a result, it is possible to enhance the adhesion strength between the first insulating layer 22 and the frame body 6 over the entire outer circumference of the first portion 34 and to thereby further reduce the separation of the first insulating layer 22 and the frame body 6.

In the embodiment, as shown in FIGS. 1, 2, and 4, the wiring board 3 further comprises a metal member 37 which corresponds to a part of the air gap 36 and is disposed in contact with the concave portion side surface 33a of the first insulating layer 22. In other words, the wiring board 3 further comprises the metal member 37 disposed between the air gap 36 in the second portion 35 and the concave portion side surface 33a of the first insulating layer 22 in the second portion 35. As a result, it is possible to reduce warpage or deformation of the substrate 5 by the metal member 37 with high rigidity reinforcing the substrate 5. Therefore, it is possible to reduce disconnection of the conductive layer 8 in the substrate 5 and to enhance the electrical reliability of the wiring board 3. In such a case, the air gap 36 is defined by the metal member 37, the frame body 6, and the first insulating layer 22.

The metal member 37 according to the embodiment is made of copper. As a result, it is possible to enhance rigidity of the metal member 37 and to reinforce the substrate 5. In addition, it is possible to increase thermal conductivity of the metal member 37 and release heat emitted by the electronic component 2 to the outside of the wiring board 3. Moreover, it is possible to reduce diffusion of electromagnetic noise by the metal member 37. The thickness (Z direction) of the metal member 37 is equal to or greater than 3 µm and equal to or less than 20 µm, for example. The width of the metal member 37 (the length between the side surface of the metal member 37 on the side of the air gap 36 and the side surface on the opposite side) is equal to or greater than 0.1 mm and equal to or less than 3 mm, for example.

In the embodiment, as shown in FIG. 2, the metal member 37 surrounds the first portion 34 in the circumferential direction of the through-hole P. As a result, since the metal member 37 with high rigidity functions as a reinforcing frame for the substrate 5, it is possible to reduce warpage or deformation of the substrate 5.

In the embodiment, as shown in FIG. 4, the metal member 37 includes a recessed portion 38 in the side surface on the side of the air gap 36. As a result, since the stress applied between the first insulating layer 22 and the frame body 6 is easily concentrated on the recessed portion 38 of the metal member 37 with high rigidity, it is possible to reduce the separation of the first insulating layer 22 and the frame body 6. In addition, since the resin member 30 enters the recessed portion 38, it is possible to enhance adhesion strength between the metal member 37 and the resin member 30 by an anchor effect. Therefore, it is possible to reduce the separation of the first insulating layer 22 and the frame body 6. The depth (XY plane direction) of the recessed portion 38 is equal to or greater than 5 µm and equal to or less than 300 µm, for example. The width (Z direction) of the recessed portion 38 is equal to or greater than 3 µm and equal to or less than 25 µm, for example.

In the embodiment, the recessed portion 38 is formed in the side surface of the metal member 37 on the side of the air gap 36 from one end on the side of the frame body 6 to the other end on the opposite side to the frame body 6. As a result, the stress applied between the first insulating layer 22 and the frame body 6 is easily concentrated on the recessed portion 38 of the metal member 37 with high rigidity. In addition, it is possible to enhance the anchor effect by the recessed portion 38 and to further enhance the adhesion strength between the metal member 37 and the resin member 30.

In the embodiment, the recessed portion 38 has a concave curved surface shape. As a result, since the resin member 30 easily enters the recessed portion 38, it is possible to enhance the anchor effect by the recessed portion 38.

In the embodiment, the metal member 37 is in contact with the other main surface of the frame body 6 on the side of the first insulating layer 22 and with the concave portion side surface 33a of the concave portion 33 on the concave portion bottom surface. As a result, the stress applied between the first insulating layer 22 and the frame body 6 is easily concentrated by the recessed portion 38 of the metal member 37 with high rigidity. The metal member 37 according to the embodiment is in direct contact with the other main surface of the frame body 6 on the side of the first insulating layer 22 and the concave portion side surface 33a and the concave bottom surface of the concave portion 33.

In the embodiment, as shown in FIG. 4, the inner wall of the through-hole P in the frame body 6 includes, at one end on the side of the first insulating layer 22, a projection portion 39 which projects to the inside of the through-hole P. As a result, it is possible to enhance the adhesion strength between the frame body 6 and the resin member 30 by the anchor effect of the projection portion 39. Therefore, it is possible to reduce the separation of the frame body 6 and the resin member 30 and to reduce the separation of the frame body 6 and the first insulating layer 22. The height (XY plane direction) of the projection portion 39 is equal to or greater than 10 μm and equal to or less than 500 μm, for example. The width (Z direction) of the projection portion 39 is equal to or greater than 10 μm and equal to or less than 500 μm, for example.

In the embodiment, a side surface of the projection portion 39 on the opposite side to the first insulating layer 22 (hereinafter, referred to as a first side surface 39a) has a concave curved surface shape. As a result, it is possible to easily mount the electronic component 2 into the through-hole P or to easily inject the resin member 30 into the through-hole P, and air bubbles do not easily remain between the electronic component 2 and the wiring board 3. As a result, it is possible to reduce the occurrence of ion migration due to the air bubbles in the connecting portion between the electronic component 2 and the wiring board 3 and to obtain the mounting structure 1 with excellent electrical reliability.

In the embodiment, a side surface of the projection portion 39 on the side of the first insulating layer 22 (hereinafter, referred to as a second side surface 39b) has a planar shape. The second side surface 39b of the projection portion 39 can also be regarded as a bottom surface of the projection portion 39. As a result, it is possible to easily fill the air gap 36 with the resin member 30 and to thereby further enhance the adhesion strength between the first insulating layer 22 and the frame body 6.

In the embodiment, the content rate of the third filler particles 32 in the resin member 30 is higher than the content rate of the first filler particles in the first resin layer 10. As a result, it is possible to increase the Young's modulus of the resin member 30 and to firmly fix the electronic component 2 with the resin member 30. Therefore, it is possible to reduce breakage in the connecting portion between the electronic component 2 and the wiring board 3. In addition, it is possible to reduce the thermal expansion coefficient of the resin member 30 and to reduce the difference between the thermal expansion coefficients of the resin member 30 and the electronic component 2. In the embodiment, a part of the resin member 30 which has entered the air gap 36 includes the third filler particles 32.

In the embodiment, as shown in FIGS. 1 and 3(a), the pads 23 are disposed in the bottom surface of the concave portion 33. The pads 23 are disposed in the via holes V which open in the concave portion 33. The top surfaces of the pads 23 are in the same plane as that of the bottom surface of the concave portion 33. As a result air bubbles do not easily remain between the electronic component 2 and the wiring board 3 when the resin member 30 is injected. The pads 23 are electrically connected to the via conductors 9 in the via holes V in which the pads 23 are disposed.

Next, a description will be given of a manufacturing method of the aforementioned mounting structure 1 with reference to FIGS. 5 to 12.

(1) As shown in FIG. 5(a), the core substrate 25 of the frame body 6 is produced. Specifically, the production is performed as follows, for example.

A laminated plate formed of the base 27, which is obtained by curing prepreg, and metal foils such as copper foils which are disposed on both main surfaces of the base 27 is prepared. Then, a through-hole is formed in the laminated plate by using laser processing, drill processing, or otherwise. Then, the tubular through-hole conductor 28 is formed by using an electroless plating method, an electrolytic plating method, a deposition method, or a sputtering method, for example to cause a conductive material to adhere to the inside of the through hole. Then, the insulating body 29 is formed by filling the inside of the through-hole conductor 28 with uncured resin and curing the resin. Then, the conductive layers 8 are formed by using, for example, the electroless plating method, the electrolytic plating method, or otherwise to cause a conductive material such as copper to adhere to the insulating body 29 and then patterning the metal foil and the conductive material on the base 27. The conductive layers 8 include a metal layer 40 corresponding to the concave portion 33.

The core substrate 25 can be produced as described above.

(2) As shown in FIGS. 5(b) to 7(b), a laminated sheet 43 which includes a support sheet 41, the inorganic insulating layer 11 disposed on the support sheet 41, and a resin layer precursor 42 disposed on the inorganic insulating layer 11 and including uncured resin is produced. Specifically, the production is performed as follows, for example.

First, as shown in FIG. 5(b), a resin-adhering sheet 44 which includes the support sheet 41 and the second resin layer 12 disposed on the support sheet 41 is prepared. Then, as shown in FIGS. 5(c) and 5(d), a slurry 46 which includes the inorganic insulating particles 15 and a solvent 45 in which the inorganic insulating particles 15 are dispersed is prepared, and one main surface of the second resin layer 12 is coated with the slurry 46. Then, as shown in FIGS. 6(a) and 6(b), a powder layer 47 formed of remaining inorganic insulating particles 15 is formed by evaporating the solvent 45 from the slurry 46 and causing the inorganic insulating particles 15 to remain on the support sheet 41. In the powder layer 47, the first inorganic insulating particles 18 are in contact with each other at proximate portions. Then, as shown in FIGS. 6(c) and 6(d), the inorganic insulating layer 11 is formed by heating the powder layer 47 and connecting the adjacent first inorganic insulating particles 18 at proximate portions.

Then, as shown in FIGS. 7(a) and 7(b), the gap 16 is filled with a part of the resin layer precursor 42 by laminating the resin layer precursor 42 including the uncured resin, which will be the first resin 13, and the first filler particles 14 on the inorganic insulating layer 11 and heating and pressurizing the inorganic insulating layer 11 and the resin layer precursor 42 which are laminated in the thickness direction. It is possible to produce the laminated sheet 43 as described above.

In the embodiment, the support sheet 41 is coated with the slurry 46 which includes the plurality of first inorganic insulating particles 18 having a particle diameter of equal to or greater than 3 nm and equal to or less than 110 nm and the solvent 45 with the first inorganic insulating particles 18 dispersed therein. As a result, since the particle diameter of the first inorganic insulating particles 18 is equal to or greater than 3 nm and equal to or less than 110 nm, it is possible to firmly connect a part of the plurality of first inorganic insulating particles 18 under a low-temperature condition. It is presumed that this is because the first inorganic insulating particles 18 lowers the temperature at which the part of the plurality of first inorganic insulating particles 18 are firmly connected to each other, due to minute first inorganic insulating particles 18 causing active motion of atoms, particularly surface atoms of the first inorganic insulating particles 18.

Therefore, it is possible to firmly connect the plurality of first inorganic insulating particles 18 under the low-temperature condition of less than a crystallization onset temperature of the first inorganic insulating particles 18, or further at a temperature of equal to or less than 250° C. In addition, it is possible to connect the first inorganic insulating particles 18 to each other and to connect the first inorganic insulating particles 18 and the second inorganic insulating particles 19 only in proximate regions while keeping the particle shapes of the first inorganic insulating particles 18 and the second inorganic insulating particles 19 by performing heating at such a low temperature. As a result, it is possible to easily from the gap 16 of the opened pore. Moreover, it is possible to firmly connect the first inorganic insulating particles 18 to each other at a temperature of less than a decomposition temperature of the second resin 20 in the second resin layer 12. Therefore, it is possible to reduce damage on the second resin layer 12.

In addition, the temperature at which the first inorganic insulating particles 18 can be firmly connected to each other is about 250° C. in a case where the average particle diameter of the first inorganic insulating particles 18 is set to 110 nm, and the temperature is about 150° C. in a case where the average particle diameter of the first inorganic insulating particles 18 is set to 15 nm.

In the embodiment, the support sheet 41 is coated with the slurry 46 which further includes the plurality of second inorganic insulating particles 19 having a particle diameter of equal to or greater than 0.5 μm and equal to or less than 5 μm. As a result, it is possible to reduce gaps of the inorganic insulating particles 15 in the slurry 46 by the second inorganic insulating particles 19 having a larger average particle diameter than that of the first inorganic insulating particles 18 and to thereby reduce contraction of the powder layer 47 formed by evaporating the solvent 45. Therefore, it is possible to reduce the contraction of the powder layer 47 with a planar shape, which easily contracts in the main surface direction to a large extent, and to thereby reduce occurrence of cracks along the thickness direction in the powder layer 47.

The support sheet 41 is a resin film such as PET film or a metal foil such as copper foil, for example. The solvent 45 is an organic solvent which contains, for example, methanol, isopropanol, methyl ethyl ketone, methyl isobutyl ketone, xylene, or a mixture of two or more kinds selected therefrom. The dry temperature of the slurry 46 is equal to or greater than 20° C. and less than a boiling point of the solvent 45, for example. The heating temperature for heating the powder layer 47 is equal to or greater than the boiling point of the solvent 45 and less than the crystallization onset temperature of the first inorganic insulating particles 18, and furthermore, equal to or greater than 100° C. and equal to or less than 250° C.

The heating temperature at the time of heating and pressurizing the inorganic insulating layer 11 and the resin layer precursor 42 which are laminated is equal to or greater than 50° C. and equal to or less than 100° C., for example. Since the heating temperature is less than a curing start temperature of the resin layer precursor 42, it is possible to maintain the resin layer precursor 42 in an uncured state.

Figure 8:
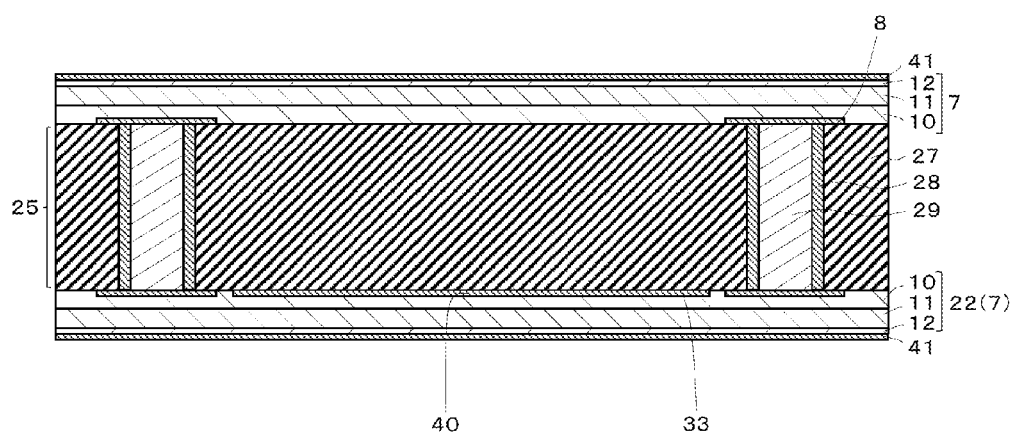
FIG. 8($a$) is a sectional view illustrating the manufacturing process of the mounting structure shown in FIG. 1, and FIG. 8($b$) is a partial enlarged view of an inorganic insulating layer in FIG. 8($a$)
Figure 8:
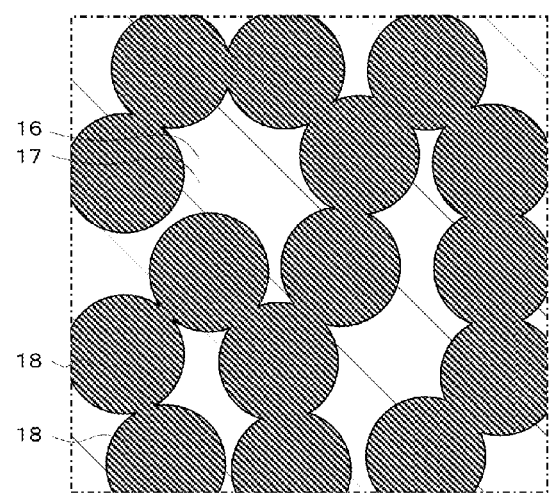

(3) As shown in FIGS. 8(*a*) to 10(*a*), the conductive layer 8 and the via conductor 12 are formed after forming the insulating layer 7 by laminating the laminated sheet 43 on the core substrate 25. Specifically, the formation is performed as follows, for example.

First, the laminated sheet 43 is laminated on each of both main surfaces of the core substrate 25 while disposing the resin layer precursor 42 on the side of the core substrate 25. Then, the laminated sheets 43 are made to adhere to the core substrate 25 by heating and pressurizing the laminated core substrate 25 and the laminated sheets 43 in the thickness direction. At this time, the resin layer precursor 42 surrounds the metal layer 40. Then, as shown in FIGS. 8(*a*) and 8(*b*), the first resin 13 is obtained by curing the uncured resin, and the first resin layer 10 is obtained from the resin layer precursor 42 by heating the resin layer precursor 42. As a result, it is possible to form the insulating layer 7. Since the first resin layer 10 surrounds the metal layer 40 at this time, the concave portion 33 with a shape corresponding to the metal layer 40 is formed in the first resin layer 10, and the concave portion 33 is brought into a state where the metal layer 40 is disposed therein. In addition, the resin portion 17 is obtained from the part of the resin layer precursor 42, which has entered the gap 16 in Process (2).

Figure 9:
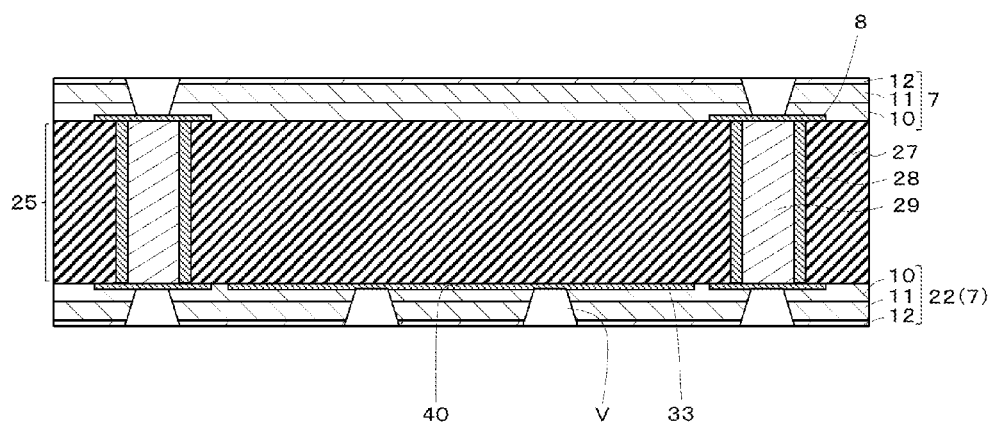
FIGS. 9($a$) and 9($b$) are sectional views illustrating the manufacturing process of the mounting structure shown in FIG. 1.
Figure 9:
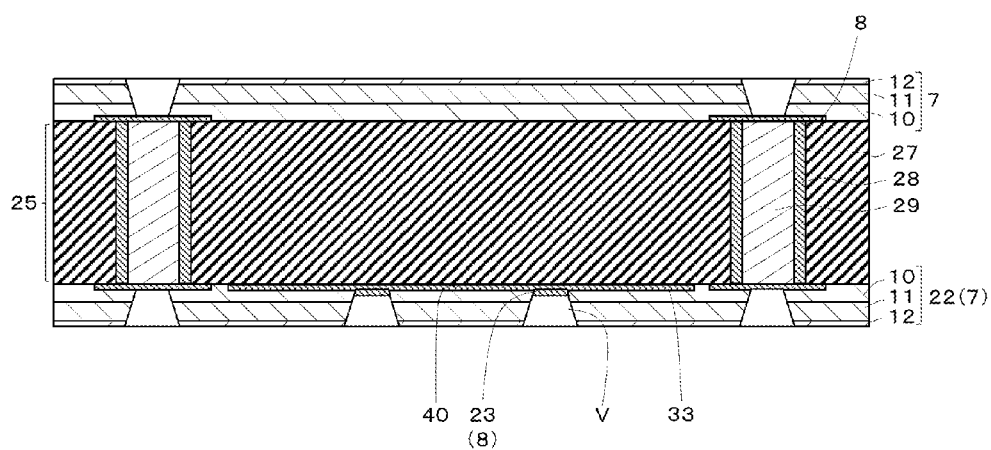

Next, as shown in FIG. 9(*a*), the support sheet 41 is chemically or mechanically separated from the insulating layer 7, and then the plurality of via holes V penetrating through the insulating layer 7 in the thickness direction are formed by using laser processing. At this time, the conductive layer 8 is exposed from the bottom surfaces of the plurality of via holes V, and the metal layer 40 is exposed from the bottom surface of at least one via V. Then, as shown in FIG. 9(*b*), the pads 23 are formed by the electrolytic plating method to cause a conductive material, which is different from that of the metal layer 40, to adhere to the metal layer 40 exposed to the inside of the via V. Then, the conductive material is made to adhere to the inner walls of the via holes V and the main surface of the insulating layer 7 and the conductive material is patterned by using a semi-additive method or a subtractive method using the electroless plating method and the electrolytic plating method. In doing so, as shown in FIG. 10(*a*), the conductive layer 8 is formed on the insulating layer 7 while forming the via conductors 9 in the via holes V.

For the heating and the pressurizing for causing the laminated sheets 43 to adhere to the core substrate 25, the same conditions as those in Process (2) can be employed. In addition, the heating temperature for curing the uncured resin to obtain the first resin 13 is equal to or greater than the curing start temperature of the uncured resin and less than the decomposition temperature, for example.

Figure 10:
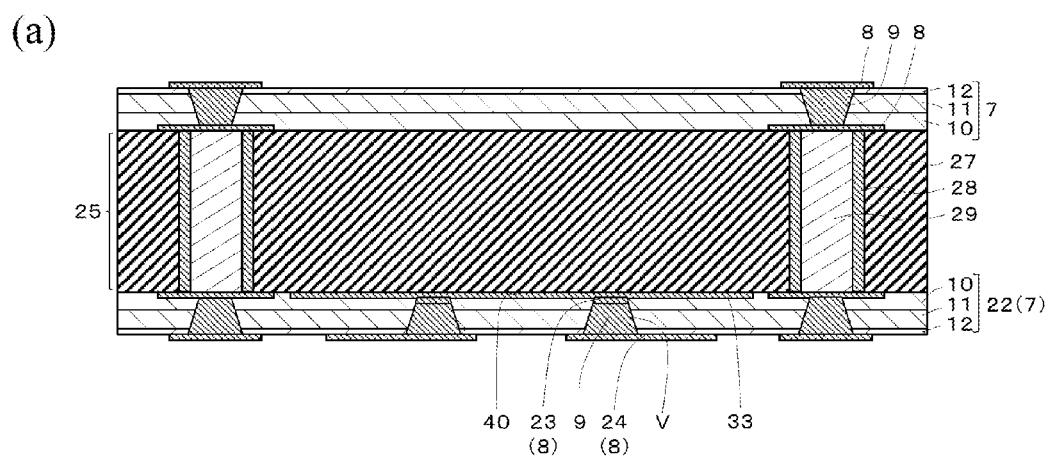
FIGS. 10($a$) and 10($b$) are sectional views illustrating the manufacturing process of the mounting structure shown in FIG. 1.
Figure 10:
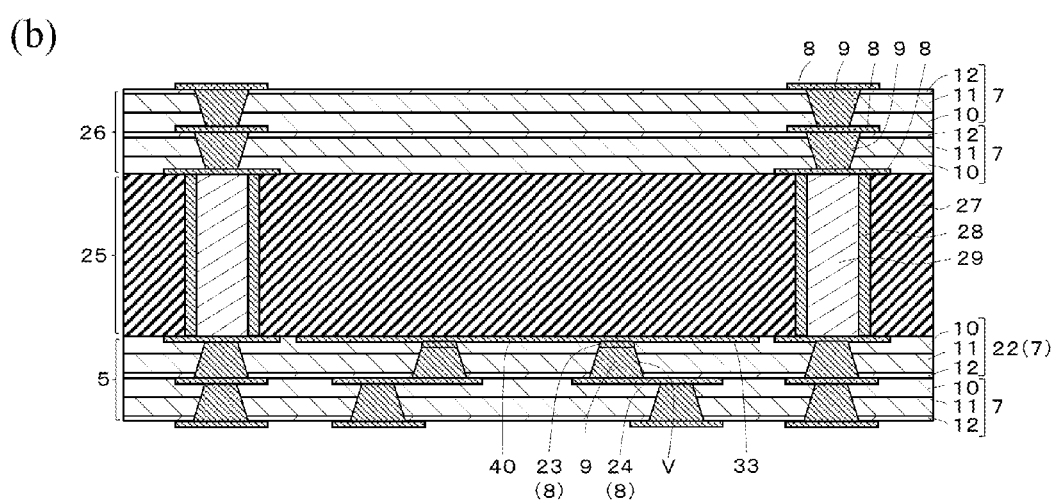

(4) As shown in FIG. 10(*b*), the built-up layer 26 is formed on the other main surface of the core substrate 25 while the substrate 5 is formed on one surface of the core substrate 25 by repeating Process (3). In this process, the core substrate 25 and the built-up layer 26 form a flat plate with no through-hole P. In addition, it is possible to further laminate the substrates 5 and the built-up layers 26 by repeating this process.

Figure 11:
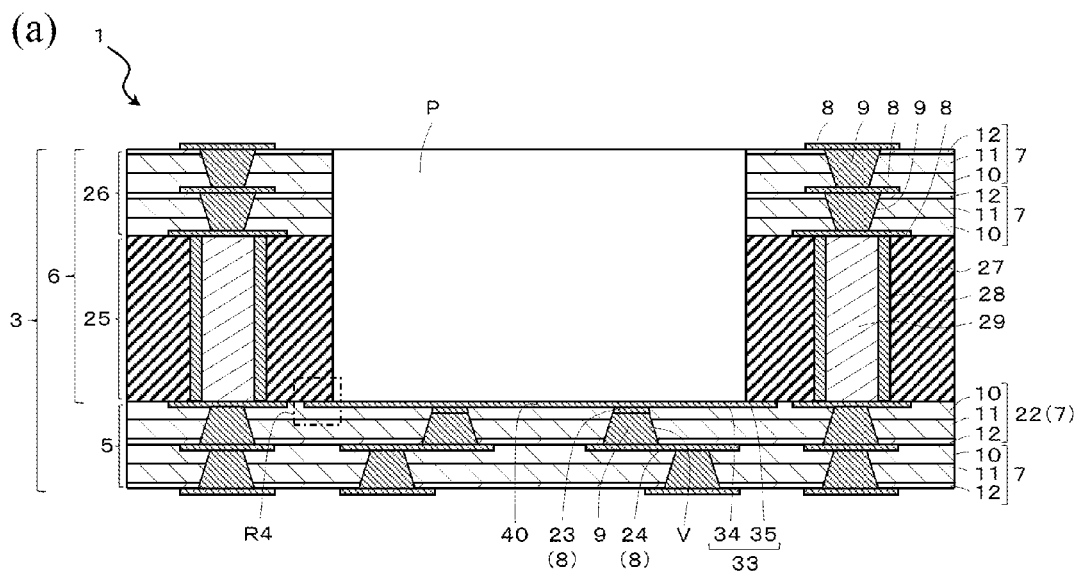
FIG. 11($a$) is a sectional view illustrating the manufacturing process of the mounting structure shown in FIG. 1, and FIG. 11($b$) is an enlarged view of an R4 portion in FIG. 11($a$)
Figure 11:
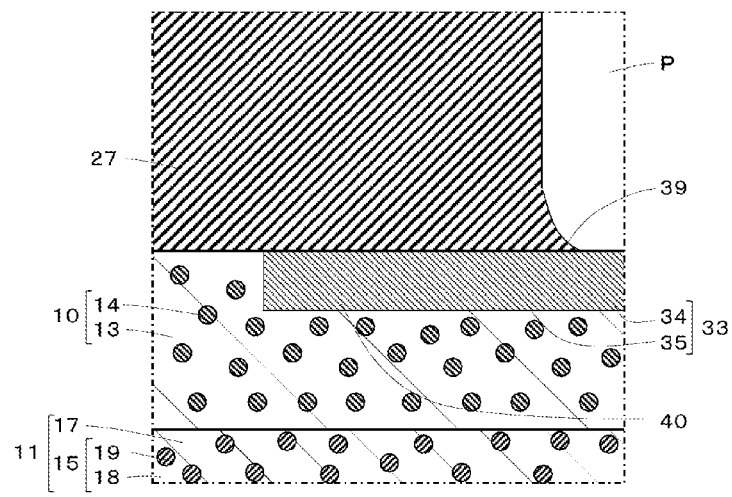
Figure 12:
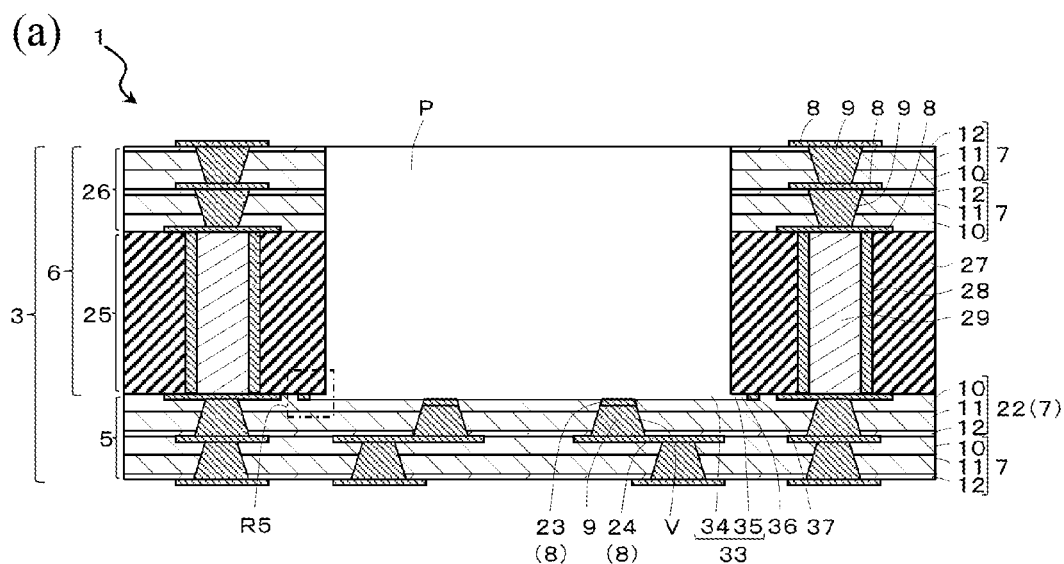
FIG. 12($a$) is a sectional view illustrating the manufacturing process of the mounting structure shown in FIG. 1, and FIG. 12($b$) is an enlarged view of an R5 portion in FIG. 12($a$).
Figure 12:
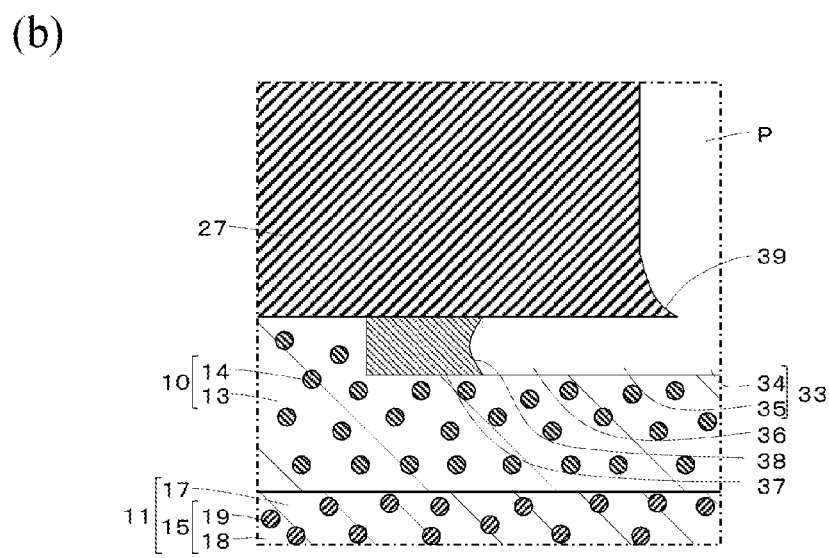

(5) As shown in FIGS. 11(*a*) to 12(*b*), the frame body 6 with the through-hole P is formed and the wiring board 3 is formed by using a sand blast method. Specifically, the formation is performed as follows for example.

First, abrasive grains are ejected toward one main surface of the built-up layer 26 on the opposite side to the core substrate 25 by using the sand blast method. In doing so, as shown in FIGS. 11(*a*) and 11(*b*), the through-hole P penetrating through the built-up layer 26 and the core substrate 25 in the thickness direction is formed such that the metal layer 40 is exposed to the through-hole P. The concave portion 33 which includes the first portion 34 positioned between the through-hole P and the insulating layer 7 and the second portion 35 positioned between the frame body 6 and the insulating layer 7 is formed as will be described later by forming the through-hole P with a narrower width than that of the metal layer 40 at this time.

Next, as shown in FIGS. 12(a) and 12(b), by etching the metal layer 40 exposed to the through hole P using an etching solution, the metal layer 40 is removed from the first portion 34 of the concave portion 33 and the metal layer 40 is removed from at least a part of the second portion 35. In doing so, the first portion 34 is formed as a space connected to the through-hole P, and the air gap 36, which is a space connected to the first portion 34, is formed in the second portion 35. In addition, the metal member 37 is obtained from a part of the metal layer 40 by causing the part of the metal layer 40 to remain in the second portion 35.

As described above, the frame body 6 with the through-hole P is formed, the concave portion 33 is formed, and the air gap 36 is formed between the surface of the frame body 6 on the side of the insulating layer 7 and the one main surface of the insulating layer 7.

In the embodiment, the through-hole P is formed while the metal layer 40 is exposed by using the sand blast method. As a result, it is possible to suppress cutting of the bottom surface of the concave portion 33 and to obtain a flatter bottom surface of the concave portion 33 by using the metal layer 40, which is not easily cut by the sand blast method, as a cutting stopper layer. In doing so, it is possible to reduce connection failure between the electronic component 2 and the wiring board 3 at the time of mounting the electronic component 2. In addition, by appropriately adjusting processing conditions such as a shape of the abrasive grains, an ejection pressure of the abrasive grains, and an ejection time of the abrasive grains in the sand blast method, it is possible to easily form the projection portion 39 according to the embodiment.

Here, in the sand blast method, there is a case where separation occurs between the inner wall of the through-hole P and the metal layer 40 due to stress applied between the inner wall of the through-hole P and the metal layer 40 by the ejection of the abrasive grains. In contrast, in the embodiment, after the metal layer 40 is removed and the air gap 36 is formed in the second portion 35, a part of the resin member 30 is made to enter the air gap 36 as will be described later. Therefore, it is possible to cause adhesion between the first insulating layer 22 and the frame body 6 with the part of the resin member 30 and to reduce the separation of the first insulating layer 22 and the frame body 6.

The abrasive grains ejected by the sand blast method are made of inorganic material such as silicon oxide, aluminum oxide, or silicon carbide, for example. In addition, an average particle diameter of the abrasive grains is equal to or greater than 2 μm and equal to or less than 80 μm, for example. The ejection of the abrasive grains is performed by air (dry blast).

In the embodiment, the insulating layer 7 includes the inorganic insulating layer 11. As a result, it is possible to reduce deformation of the insulating layer 7 by the inorganic insulating layer 11 with high rigidity when stress is applied to the insulating layer 7 due to the abrasive grains ejected by the sand blast method. Accordingly, it is possible to obtain a flatter bottom surface of the concave portion 33.

In the embodiment, the metal layer 40 is removed from the first portion 34 after the through-hole P is formed. As a result, it is possible to obtain a flatter bottom surface of the concave portion 33 by removing the metal layer 40 and exposing the bottom surface of the concave portion 33.

In the embodiment, the pads 23 are exposed to the bottom surface of the first portion 34 by selectively etching the metal layer 40 from among the metal layer 40 and the pads 23 which are made of mutually different conductive materials. As a result, it is possible to easily form the pads 23 according to the embodiment. In a case where the metal layer 40 is made of copper and the pads 23 are made of nickel, it is possible to use a ferric chloride solution or a copper chloride solution as the etching solution.

In the embodiment, the metal layer 40 is removed from at least a part of the second portion 35 by etching the metal layer 40. As a result, it is possible to easily form the air gap 36 and the metal member 37 according to the embodiment by appropriately adjusting etching conditions such as a type of the etching solution and etching time.

(6) The mounting structure 1 shown in FIG. 1 is produced by mounting the electronic component 2 on the wiring board 3 and covering the electronic component 2 with the resin member 30. Specifically, the production is performed as follows, for example.

First, the electronic component 2 is accommodated in the through-hole P in the wiring board 3, and the electronic component 2 is flip-chip mounted on the substrate 5 via the bump 4. At this time, the bump 4 and the pads 23 are electrically connected. Then, the uncured resin member in a liquid state is disposed in the through-hole P in the wiring board 3. At this time, the electronic component 2 is covered with the uncured resin member, and the uncured resin member is disposed between the electronic component 2 and the first insulating layer 22. Furthermore, a part of the uncured resin member is made to enter the first portion 34 of the concave portion 33 and the air gap 36. Then, the resin member 30, a part of which has entered the air gap 36, is formed by thermally curing the uncured resin member.

Thus, it is possible to produce the mounting structure 1.

The invention is not limited to the aforementioned embodiment, and various modifications, improvements, combinations, and the like can be made without departing from the scope of the invention.

For example, although the configuration is exemplified in which the electronic component 2 is flip-chip mounted on the wiring board 3 in the aforementioned embodiment of the invention, the electronic component 2 may be wire-bonding mounted on the wiring board 3.

Although the configuration is exemplified in which the mounting structure 1 includes the mounted component mounted on the frame body 6 in the aforementioned embodiment of the invention, the mounting structure 1 may not be provided with the mounting component.

Although the configuration is exemplified in which the substrate 5 is the coreless substrate in the aforementioned embodiment of the invention, the substrate 5 may be a built-up substrate having the core substrate and the built-up layer.

Although the configuration is exemplified in which the frame body 6 includes the core substrate 25 and the built-up layer 26 in the aforementioned embodiment of the invention, another member may be used as the frame body 6, the frame body 6 may be formed only of the core substrate 25, or alternatively, the frame body 6 may be formed of a metal plate, a resin plate, or the like.

Although the configuration is exemplified in which the insulating layer 7 includes the first resin layer 10, the inorganic insulating layer 11, and the second resin layer 12 in the aforementioned embodiment of the invention, it is sufficient that the insulating layer 7 includes the first resin layer 10 and the inorganic insulating layer 11, and the second resin layer 12 may not be included.

In addition, although the configuration is exemplified in which the inorganic insulating particles 15 include the first inorganic insulating particles 18 and the second inorganic insulating particles 19 in the aforementioned embodiment of the invention, the inorganic insulating particles 15 may not include the second inorganic insulating particles 19 or may not include the first inorganic insulating particles 18.

Although the configuration is exemplified in which the via conductors 12 are accommodated in the via holes V in the aforementioned embodiment of the invention, the via conductors 12 may be in the form of films covering the inner walls of the via holes V.

Although the configuration is exemplified in which the evaporation of the solvent 45 is separately performed from the heating of the powder layer 47 in Process (2) in the aforementioned embodiment of the invention, the evaporation and the heating may be concurrently performed.

Although the configuration is exemplified in which the conductive layer 8 is formed on the one main surface of the insulating layer 7 after the support sheet 41 is removed from the insulating layer 7 in Process (3) in the aforementioned embodiment of the invention, the conductive layer 8 may be formed by patterning the support sheet 41, which is made of a metal foil, on the insulating layer 7.

REFERENCE SIGNS LIST

1: Mounting structure
2: Electronic component
3: Wiring board
6: Frame body
7: Insulating layer
33: Concave portion
33a: Concave portion side surface
34: First portion
35: Second portion
36: Air gap
37: Metal member
38: Recessed portion
39: Projection portion

The invention claimed is:

1. A wiring board, comprising:
an insulating layer; and
a frame body disposed on the insulating layer,
the frame body being provided with a through-hole which contains an electronic component,
the insulating layer having a concave portion in one main surface on a frame body side,
in a plan view of the wiring board, the concave portion having a first portion positioned at the through-hole, and a second portion which is positioned at the frame body and is continuous with the first portion, an air gap being formed between the frame body and the insulating layer in the second portion, wherein
the insulating layer includes, in order from a side of the insulating layer facing the concave portion, a first resin layer, an inorganic insulating layer and a second resin layer,
the first resin layer includes a first resin and a plurality of first filler particles dispersed in the first resin,
the inorganic insulating layer includes a plurality of inorganic insulating particles, parts of which are connected to each other, and a resin portion which is disposed in a part of a gap between the inorganic insulating particles,
the second resin layer includes a second resin and a plurality of second filler particles dispersed in the second resin,
a Young's modulus of the first resin layer is equal to or greater than 0.2 GPa and equal to or less than 20 GPa and a thermal expansion coefficient of the first resin layer in each direction is equal to or greater than 20 ppm/° C. and equal to or less than 50 ppm/° C.,
a Young's modulus of the inorganic insulating layer is equal to or greater than 10 GPa and equal or less than 50 GPa, and a thermal expansion coefficient of the inorganic insulating layer in each direction is equal to or greater than 0 ppm/° C. and equal to or less than 10 ppm/° C., and
a Young's modulus of the second resin layer is equal to or greater than 0.05 GPa and equal to or less than 5 GPa, and a thermal expansion coefficient of the second resin layer in each direction is equal to or greater than 20 ppm/° C. and equal to or less than 100 ppm/° C.

2. The wiring board according to claim 1, wherein the second portion surrounds the first portion.

3. The wiring board according to claim 1,
wherein a metal member is disposed on a side surface of the concave portion of the insulating layer, and the air gap is defined by the metal member, the frame body, and the insulating layer.

4. The wiring board according to claim 3,
wherein the metal member surrounds the first portion.

5. The wiring board according to claim 3,
wherein the metal member includes a recessed portion in a side surface on an air gap side.

6. The wiring board according to claim 1,
wherein an inner wall of the through-hole in the frame body includes, at one end on an insulating layer side, a projection portion which projects toward an inside of the through-hole.

7. The wiring board according to claim 6,
wherein a side surface of the projection portion on an opposite side to the insulating layer has a concave curved surface shape.

8. The wiring board according to claim 1,
wherein a surface of the frame body on an insulating layer side which surface is positioned at the second portion, has a planar shape.

9. A mounting structure, comprising:
the wiring board according to claim 1;
an electronic component disposed on the insulating layer and inside the through-hole; and
a resin member which is disposed in the first portion, a part of which enters the air gap.

* * * * *